United States Patent [19]
Hernandez

[11] Patent Number: 4,475,143
[45] Date of Patent: Oct. 2, 1984

[54] DECOUPLING CAPACITOR AND METHOD OF MANUFACTURE THEREOF

[75] Inventor: Jorge M. Hernandez, Mesa, Ariz.

[73] Assignee: Rogers Corporation, Rogers, Conn.

[21] Appl. No.: 456,654

[22] Filed: Jan. 10, 1983

[51] Int. Cl.³ .................... H01G 1/14; H01G 7/00
[52] U.S. Cl. ................................ 361/306; 29/25.42
[58] Field of Search ............... 361/304, 306, 311–314, 361/321; 29/25.42

[56] References Cited

U.S. PATENT DOCUMENTS

| | | | |
|---|---|---|---|
| 3,098,955 | 7/1963 | Davis et al. | 361/312 |
| 3,264,537 | 8/1966 | Delaney et al. | 361/312 |
| 3,439,395 | 4/1969 | Claypoole et al. | 29/25.42 |
| 3,880,493 | 4/1975 | Lockhart | 339/147 R |
| 4,236,046 | 11/1980 | DeVries | 361/306 X |
| 4,281,360 | 7/1981 | Brehse | 361/311 X |
| 4,298,848 | 11/1981 | Kurose | 361/306 X |
| 4,356,532 | 10/1982 | Donsher et al. | 361/393 |
| 4,394,713 | 7/1983 | Yoshida | 361/433 |

FOREIGN PATENT DOCUMENTS

| | | |
|---|---|---|
| U4887547 | 1/1972 | Japan . |
| P5141864 | 10/1974 | Japan . |
| U53-118043 | 2/1977 | Japan . |
| U5653558 | 6/1978 | Japan . |
| U5552827 | 10/1978 | Japan . |
| U55-112845 | 2/1979 | Japan . |
| U57197631 | 6/1981 | Japan . |
| 58-20556 | 3/1983 | Japan . |

OTHER PUBLICATIONS

Tel-Tech & Electronics Industries, Nov. 1953, p. 47, Centralab.

Primary Examiner—Donald A. Griffin
Attorney, Agent, or Firm—Fishman & Dionne

[57] ABSTRACT

A decoupling capacitor and method of manufacture thereof are presented wherein the decoupling capacitor is provided with inactive or dummy-pins to facilitate automatic insertion of the decoupling capacitor to printed circuit boards.

31 Claims, 9 Drawing Figures

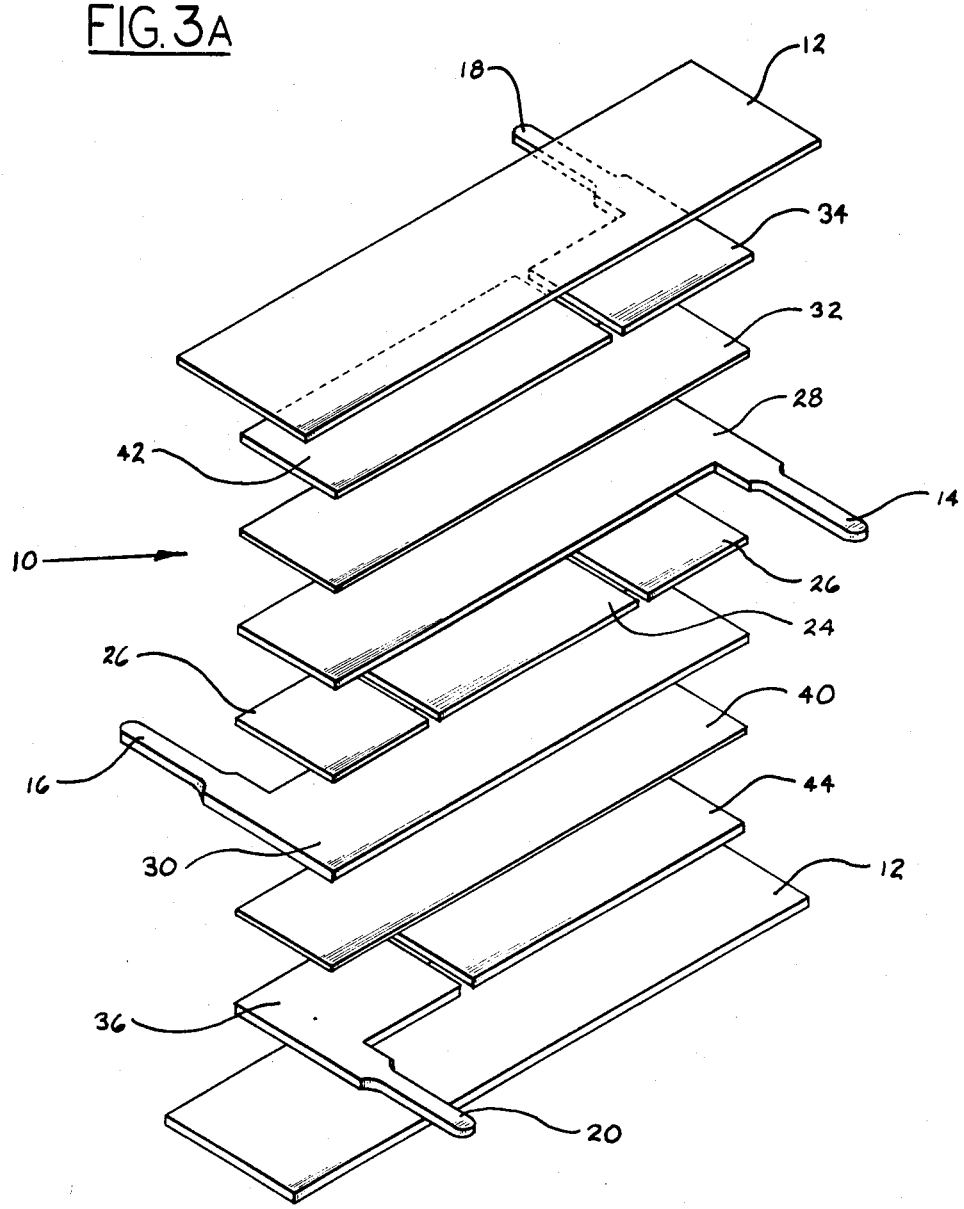

DECOUPLING CAPACITOR AND METHOD OF MANUFACTURE THEREOF

BACKGROUND OF THE INVENTION

This invention relates to the field of decoupling capacitors for integrated circuits. More particularly, this invention relates to a novel and improved decoupling capacitor, and a method of formation, thereof particularly adapted to be automatically inserted into printed circuit boards in conjunction with dual-in-line integrated circuits.

U.S. patent application Ser. No. 403,408 (which is assigned to the assignee hereof, and the entire contents of which are incorporated herein by reference) discloses a decoupling capacitor for an integrated circuit package. The decoupling capacitor of that prior application is a thin rectangular chip of ceramic material which is metallized on opposite sides and has leads from the metallized coatings on opposite sides of the chip at two points adjacent a pair of diagonally opposed corners of the rectangularly shaped ceramic chip. The two leads are bent downwardly, and the decoupling capacitor assembly is encapsulated in a film of nonconductive material. In accordance with the teachings of that prior application, the decoupling capacitor is dimensioned so as to be received in the space between the two rows of leads extending from a conventional dual-in-line integrated circuit. The two leads from the decoupling capacitor are plugged into a printed circuit board, with these leads from the capacitor being inserted into the printed circuit through holes to which the ground and power supply conductors are connected. The associated integrated circuit is then positioned over the capacitor and inserted into the board such that the power supply leads of the integrated circuit will be positioned in the same through holes of the printed circuit board in which the two capacitor leads have been inserted.

The diagonally located leads or pins on the decoupling capacitor of Application Ser. No. 403,408 have resulted in a problem when it is desired to automatically insert the decoupling capacitors into the printed circuit board. Standard auto-insertion equipment is available for inserting integrated circuit elements into the printed circuit boards. The insertion heads on standard auto-insertion equipment grasp the integrated circuit about the bent terminal pins or leads of the integrated circuit. Since there are two symmetric rows of pins on the integrated circuit element, the auto-insertion equipment can grasp the integrated circuit element symmetrically and stably for insertion. However, when insertion of the decoupling capacitor of prior Application Ser. No. 403,408 is attempted with the same auto-insertion equipment, an unstable condition and misalignment results because of the fact that the decoupling capacitor, rather than having two symmetrical rows of pins, has only two pins at diagonally opposite corners of the rectangular capacitor. Because of the presence of only the two pins, the capacitor "cocks" in the insertion head with the result that misalignment occurs between the terminals of the capacitor in the corresponding holes on the printed circuit board.

Since it is extremely desirable to auto-insert the decoupling capacitors into the printed circuit boards, and since it is equally desirable to perform that auto-insertion with the same auto-insertion equipment used with the integrated circuit elements, a significant problem is encountered with the decoupling capacitor of the prior application, not from the standpoint of its electronic operability and effectiveness, but rather from the standpoint of adapting it to high volume assembly techniques.

SUMMARY OF THE INVENTION

The above discussed and other problems of the prior art are overcome or substantially reduced by the new and improved decoupling capacitor of the present invention. In accordance with the present invention, inactive or "dummy" leads or pins are incorporated into the decoupling capacitor at the second pair of diagonally opposite corners. This provides a symmetrical pin configuration which eliminates the misalignment problem previously encountered and makes the decoupling capacitor fully suitable for auto-insertion into printed circuit boards with standard auto-insertion equipment.

In accordance with the teachings of the present invention, the dummy pins, which may also be viewed as stabilizing pins, may be incorporated into the decoupling capacitor in several mechanical configurations and by several different processes. One configuration involves the location of both dummy pins on an insulating spacer above or below one of the conducting surfaces of the capacitor; or one each of the dummy pins may be located on each side of the chip and separated from the chip by an insulating spacer. In another configuration, the dummy pins are formed in a strip of material which also includes the active pins. The active pins and dummy pins are positioned in proper registration with the ceramic chip, and the elements are then cut to length whereby the active pins remain in mechanical and electrical contact with the capacitor, while the dummy pins are mechanically connected but electrically isolated.

The above discussed and other advantages of the present invention will be apparent to and understood by those skilled in the art from the following detailed description and drawings.

BRIEF DESCRIPTION OF THE DRAWINGS

Referring now to the several FIGURES of the drawings, wherein like elements are numbered alike in the several FIGURES:

FIG. 3A is a view similar to FIG. 3 showing a modification.

DESCRIPTION OF THE PREFERRED EMBODIMENTS

Figure 1:
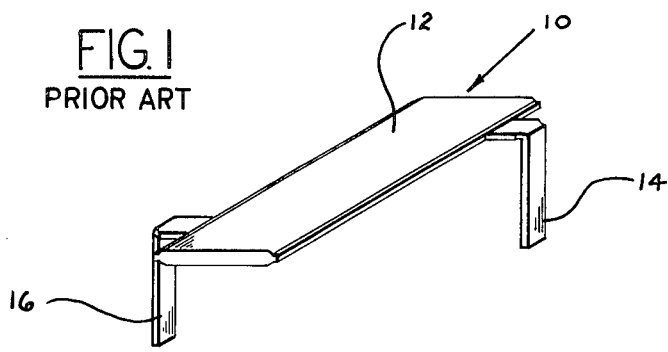
FIGS. 1 and 1A show, respectively, a perspective and a top plan view of a decoupling capacitor in accordance with U.S. Application Ser. No. 403,408.
Figure 1A:
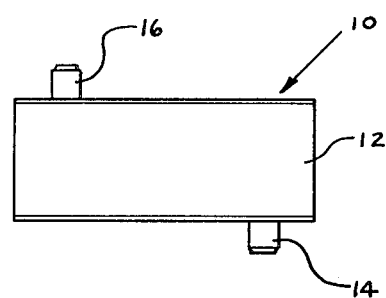

Referring first to FIGS. 1 and 1A, a decoupling capacitor 10 is shown, decoupling capacitor 10 being of the general type as the decoupling capacitor 20 of prior U.S. Application Ser. No. 403,408. As shown in FIGS. 1 and 1A, the capacitor 10 is encapsulated in an insulating outer cover film 12 such as, for example, Mylar, Tedlar or Nomex. The capacitor is generally rectangular in shape and has a pair of leads 14 and 16 extending from diagonally opposite corners of the capacitor. As described in prior U.S. Application Ser. No. 403,408, the capacitive structure within outer insulating sheath 12 may comprise a rectangularly shaped chip of ceramic material such as, for example, barium titanate ($BaTiO_3$) or strontium titanate ($SrTiO_3$). The opposite sides of the ceramic chip are metallized, such as by being coated with silver, silver paladium ink, electroless nickel or tin, copper, aluminum or zinc. Leads 14 and 16 are connected to the metallized surfaces or metal plates. The leads 14 and 16 extend outwardly a short distance in a direction which is generally parallel to the capacitor plates to which they are connected, and then they are bent, at 90°, to extend downwardly in a direction generally perpendicular to the planes of the metallized plates. The leads 14 and 16 are rectangular in shape in cross section to minimize inductance, and they are positioned and configured so that they may be inserted in the same plated through holes in a printed circuit board which receives the ground and power supply pins of integrated circuit element.

As indicated previously, the decoupling capacitor of FIGS. 1 and 1A is highly effective electronically in performing its intended function and achieving its intended results. However, it does suffer from the drawback that it does not readily lend itself to assembly techniques using auto-insertion equipment.

Figure 2:
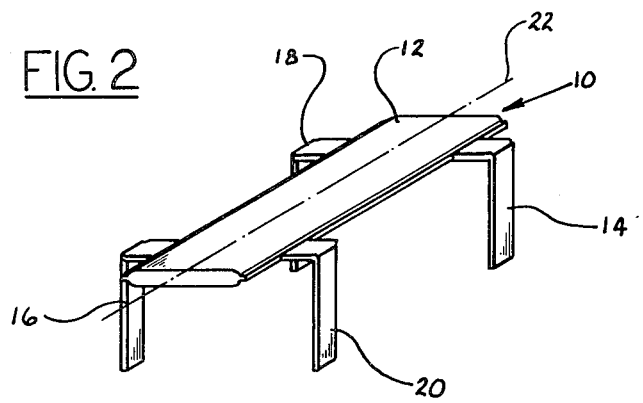
FIG. 2 shows a perspective view of a decoupling capacitor in accordance with the present invention.
Figure 3:
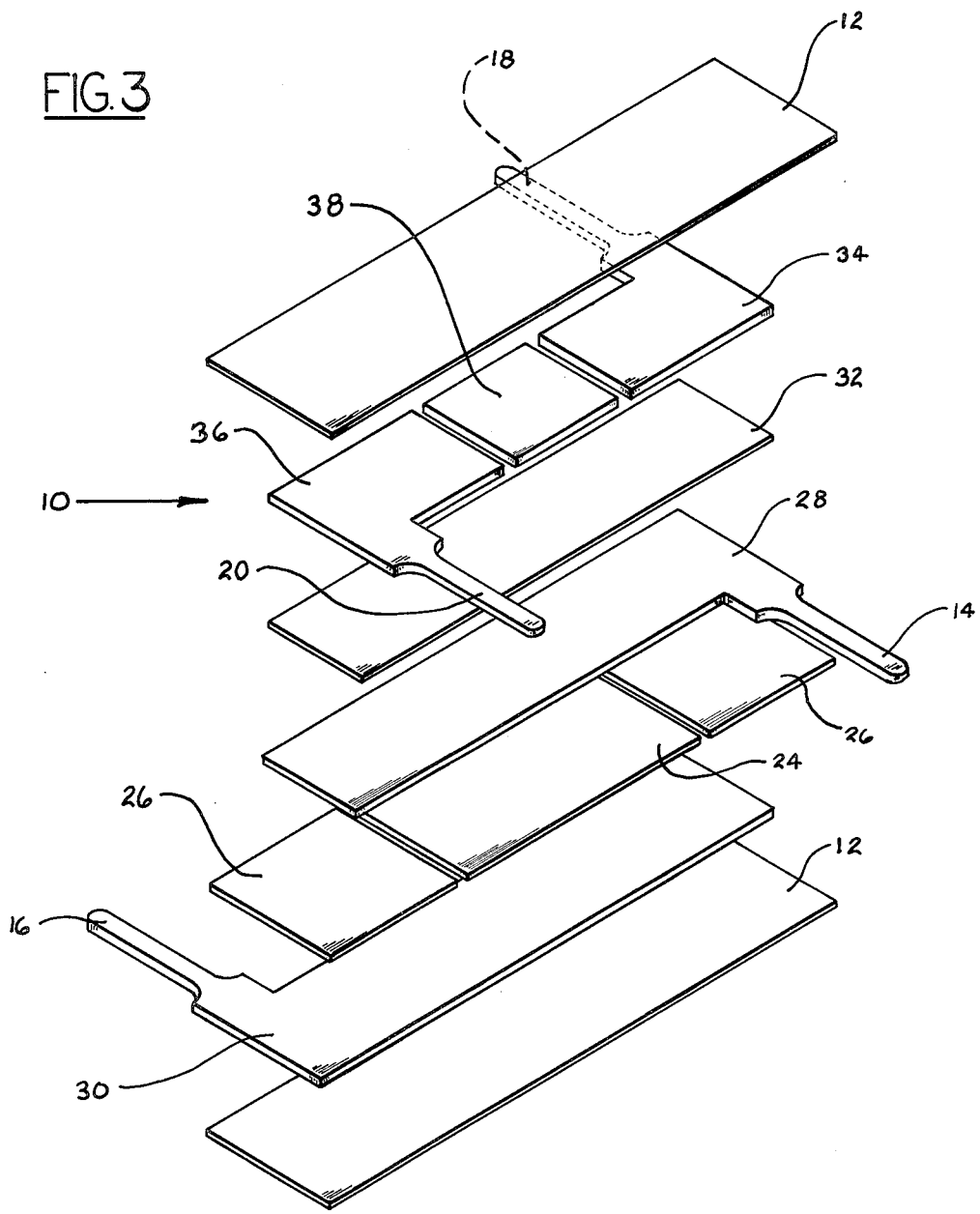
FIG. 3 shows an exploded detailed view of the decoupling capacitor of FIG. 2.

Referring now to FIGS. 2 and 3, one embodiment of the decoupling capacitor of the present invention is shown. The capacitor 10 of FIGS. 2 and 3 is also of generally rectangular shape with active leads or pins 14 and 16 at diagonally opposite corners. This decoupling capacitor also has a pair of inactive or dummy leads 18 and 20 at the other pair of diagonally opposite corners, and the main body of the capacitor is also encased in outer insulating film 12. The presence of the dummy leads 18 and 20 endows the capacitor with the characteristic of axial symmetry; i.e., the capacitor is symmetrical about longitudinal axis 22; whereas the prior art configurations of FIGS. 1 and 1A was not. The presence of the dummy leads in a configuration which provides axial symmetry makes the capacitor suitable for use with auto-insertion equipment wherein the jaws of an auto-insertion mechanism will grasp the capacitor about the sides, i.e., one jaw engages pins 16 and 18 and the other jaw engages pins 14 and 20. The presence of the dummy pins provides for pin engaging surfaces at all four corners, thus rendering the device stable when it is within the confines of the jaws of an auto-insertion machine.

Referring now to FIG. 3, the details of construction of the device of FIG. 2 are shown. The decoupling capacitor 10 has a rectangularly shaped chip 24 of ceramic material such as, for example, barium titanate or strontium titanate in one layer within the assembly. At that same layer there may be positioned insulating spacers 26 to fill the remainder of that layer. These spacers may be rectangularly shaped pieces of insulating material such as Mylar. First and second conductive plates 28 and 30 are positioned above and below the ceramic capacitor 24. Conductor elements 28 and 30 are of electrically conductive material, such as, for example copper, and they each extend substantially coextensively with the length of the center layer of the laminate assembly which includes capacitor 24 and spacers 26. Conductors 28 and 30 are in firm engagement with the opposed faces of capacitor 24 and may be adhesively bonded thereto. The conductors 28 and 30 and the ceramic chip therebetween define a capacitor. Active terminal 14 extends from one end of plate 28, and active terminal 16 extends from the other end of plate 30, so that these active pins are extending from diametrically opposite corners of the assembly. An insulating spacer 32 (such as Mylar) is positioned on top of and may be adhesively bonded to the upper surface of plate 28. On top of spacer 28, and preferably adhesively bonded thereto, are a pair of spaced metal plates (e.g., copper) 34 and 36. Dummy or inactive pin 18 extends from plate 34, and dummy or inactive pin 20 extends from plate 36. The presence of insulating spacer 32 between plate 28 and plates 34 and 36 electrically isolates plates 34 and 36 and pins 18 and 20 from the capacitor structure; and the separation between plates 34 and 36 prevents the completion of any electric circuit between them. Thus, the dummy or inactive leads 18 and 20 are mechanically present but electrically inactive. The assembly is completed by plastic insulating film 12. Film 12 is shown in two pieces in FIG. 3; but it will be understood that it may be a single encapsulating film; and it will also be understood that film 12 will preferably extend around and encapsulate the entire body of the structure, including the ends and sides thereof, so that only the active pins 14 and 16 and the inactive pins 18 and 20 project from the encapsulating insulating film. It will also be understood that the several layers of the laminate structure of the assembly of FIG. 3 (and all other embodiments as well) may be adhesively bonded together.

The decoupling capacitor will be assembled as shown in FIG. 3 with the leads 14, 16, 18 and 20 projecting outwardly in a plane generally parallel to the body of the structure. After this assembly has been completed, the pins will be bent downwardly 90° as shown in FIG. 2, so that the pins will extend in a direction generally perpendicular to the plane of the body of the capacitor. An insulating spacer 38 may be positioned between plates 34 and 36 to preserve the planar surface of the upper part of the assembly and insure electrical isolation between those plates.

Referring now to FIG. 3A, an alternative construction is shown wherein one dummy or inactive lead is on each side of the assembly. In this configuration, plate 34 and lead 18 are in the same position as in the FIG. 3 embodiment. However, plate 36 and pin 20 are positioned beneath conductive plate 30 and are separated from conductive plate 30 by another layer of insulation 40 (which, once again, may be Mylar). In order to preserve the planar outer surfaces of the assembly, the layers in which plates 34 and 36 are located may be completed or filled with additional strips of insulating material such as Mylar material 42 and 44. The outward appearance of a device constructed in accordance with the arrangement shown in FIG. 3A will be essentially the same as that of FIGS. 2 and 3, although it may be slightly thicker because of the presence of an additional layer of insulating material 40.

Referring now to FIGS. 4, 5, 6 and 7, another embodiment of the present invention and a particularly desirable method of manufacture thereof are illustrated. In accordance with this embodiment of the invention, a continuous metal strip 46, such as copper, is formed having the shape shown in FIG. 4. Preferably, the strip 46 will be formed by die-stamping from a relatively thin coil of copper strip. The stamped strip has a main body portion 48, which eventually will form a conductive plate of the capacitor. The main body portion 48 is located between registration carrier strips 50 which are formed with a plurality of registration holes 52. Body portion 48 is connected to the carrier strips 50 by a pair of struts 54 and 56 which, when the assembly is completed, will constitute an active lead and a dummy lead, respectively. Strut/lead 54 is separated from the adjacent body section 48 by a rectangular opening or space 53, while strut/lead 56 is, in the original strip form, actually attached to the next adjacent body section 48' and is actually separated by an L-shaped slit 55 from the body section 48 with which it is associated.

Figure 5:
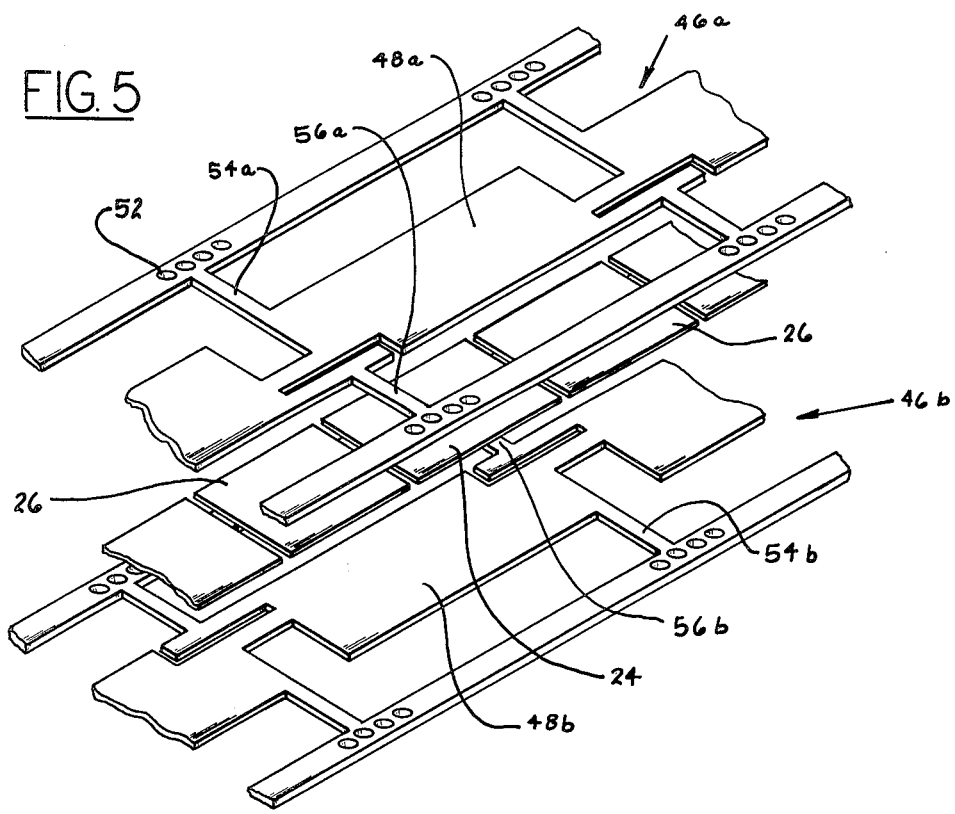
FIG. 5 shows an exploded view of parts of a decoupling capacitor in accordance with another embodiment of the present invention.

Referring now to FIG. 5, a pair of the strips 46 are assembled with a ceramic chip 24 and a pair of insulating spacers 26 positioned therebetween at the location of each pair of body sections 48. As will be noted in FIG. 5, the lower strip 46(b) is reversed or rotated 180° in its own plane relative to the upper strip 46(a) so that the upper active strut/lead 54(a) and the lower active strut/lead 54(b) are at opposite ends of their corresponding body sections 48(a) and 48(b). Proper positioning and/or alignment is maintained by registration holes 52 which will engage appropriate elements on an assembly fixture or jig. With this arrangement a pair of dummy pins 56(a) and 56(b) will also be located at diametrically opposite corners of one capacitor unit. The body portions 48(a) and 48(b) will be adhesively bonded, respectively, to the opposite sides of ceramic chip 24 and spacers 26.

Figure 6:
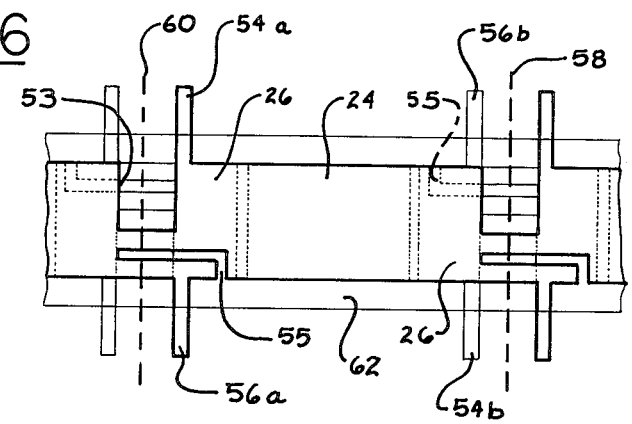
FIG. 6 shows a top plan view of a capacitor assembly of FIG. 5 prior to a final severance stage.
Figure 7:
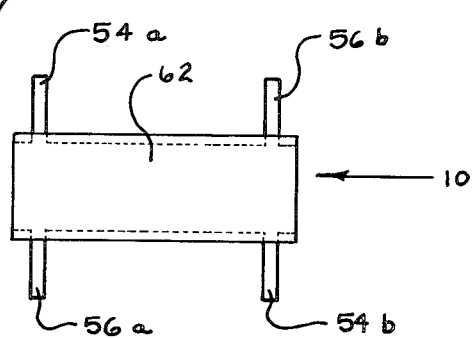
FIG. 7 shows a top plan view of a single decoupling capacitor in accordance with the FIG. 5 embodiment of the present invention.

As can best be understood from a combined consideration of FIGS. 5 and 6, a continuous strip is formed of capacitive elements consisting of body segments 48(a) and 48(b) with the chips and spacers sandwiched therebetween. The registration holes 52 assure that assembly of the body segments and terminals will take place in the appropriate relative relationship to each other. As best seen in FIG. 6, each capacitor unit will have an active terminal 54(a) and an inactive terminal 56(a) at the left end on the upper surface and an active terminal 54(b) and an inactive terminal 56(b) at the right hand end of the lower side of the assembly. An outer insulating sheath 62 will be added to encapsulate and complete the assembly. The units will then be cut or severed along the lines indicated at 58 and 60 to form the single capacitor unit shown in FIG. 7. As can be understood from a consideration of FIGS. 6 and 7, severing of the strip along the lines 58 and 60 will leave each of the dummy leads 56(a) and 56(b) as a mechanically integral part of the capacitor unit; but the L-shaped slot 55 leaves the dummy pins 56(a) and 56(b) electrically isolated from the body portions 48(a) and 48(b). The result, as seen in FIG. 7, is a decoupling capacitor having a pair of active terminals 54(a) and 54(b) extending from diametrically opposite corners and a pair of dummy or inactive terminals 56(a) and 56(b) extending from the other pair of diametrically opposite corners. All of the leads will then be bent downward 90°, as previously explained, in preparation for auto-insertion into a printed circuit board to be used in conjunction with integrated circuits or other electronic components.

Figure 4:
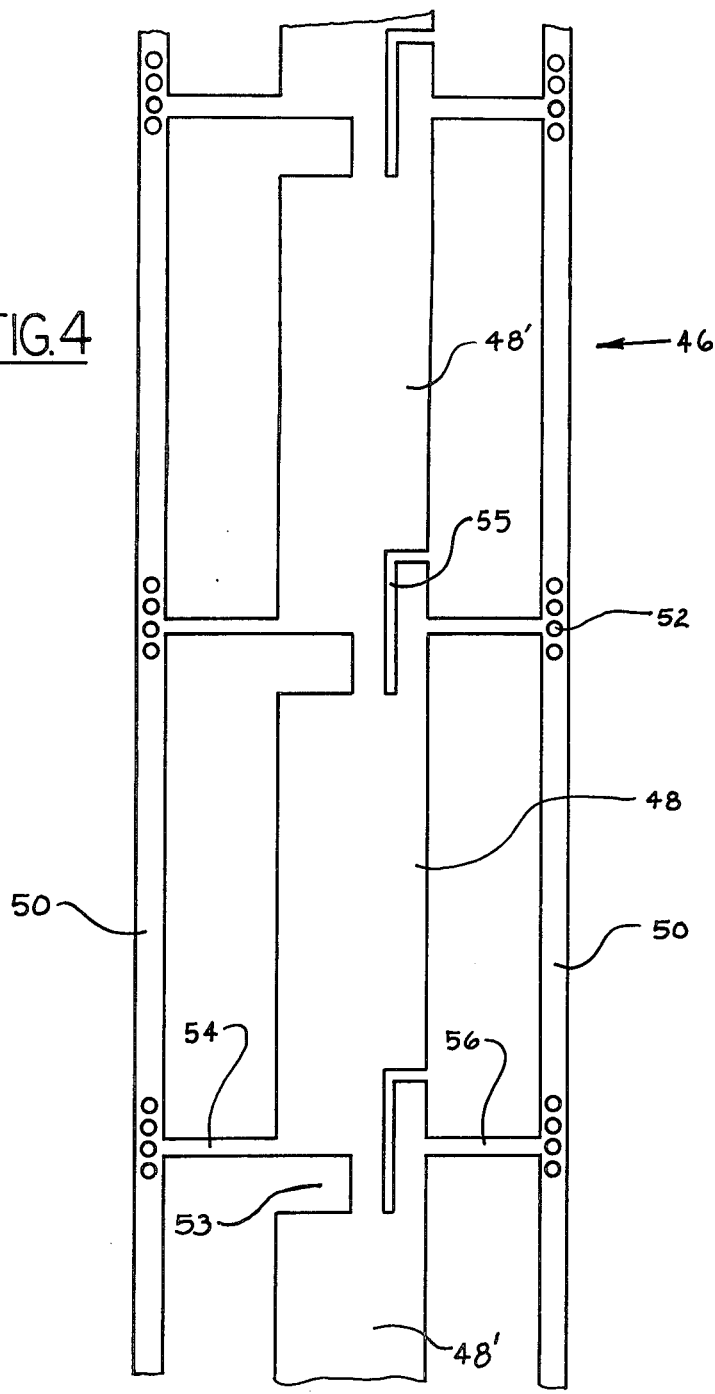
FIG. 4 shows a strip of material used in forming active and dummy pins in accordance with another embodiment of the present invention shown in FIG. 5.

It will be noted that the configuration and assembly method of FIGS. 4, 5 and 6 is particularly desirable, both from the standpoint of assembly speed and economy. This method and structure permits manufacture of the decoupling capacitors in a continuous strip form; and it also eliminates the need for additional insulating strips or spacers such as items 32, 38, 40, 42 and 44 of the previous configurations.

While preferred embodiments have been shown and described, various modifications and substitutions may be made thereto without departing from the spirit and scope of the invention. Accordingly, it is to be understood that the present invention has been described by way of illustrations and not limitation.

What is claimed is:

1. A capacitor including:

a flat ceramic element;

a metallized layer on each of a pair of opposed surfaces of said ceramic element;

a pair of contact leads, one of said contact leads being electrically connected to one of said metallized layers and extending from the capacitor at a first location thereof, and the second of said contact leads being electrically connected to the other of said metallized layers and extending from the capacitor at a second location thereof; and a pair of dummy leads, said dummy leads being electrically isolated from said metallized surfaces of said ceramic element, a first of said dummy leads extending from the capacitor at a third location, and the second of said dummy leads extending from the capacitor at a fourth location.

2. The capacitor of claim 1 including:

insulating means enclosing said ceramic element and parts of said contact leads and parts of said dummy leads.

3. The capacitor of claim 1 including:

insulating means between said metallized surfaces of said ceramic element and said dummy leads.

4. The capacitor of claim 1 wherein:

each of said contact leads extends from an extended surface, the extended surfaces being in electrical contact with opposed metallized layers of said ceramic element; and each of said dummy pins is mechanically anchored in said capacitor.

5. The capacitor of claim 4 including:

insulating means between said metallized surfaces of said ceramic element and said dummy leads.

6. The capacitor of claim 4 including:

insulation means on the side of each of said extended surfaces away from said metallized layers of said ceramic element; and extended surfaces on said dummy pins, each of said extended surfaces of said dummy pins being spaced from said metallized layers of said ceramic element by said insulation means.

7. The capacitor of claim 6 including:

insulating means enclosing said ceramic element and parts of said contact leads and parts of said dummy leads.

8. The capacitor of claim 6 including:

insulating means between said metallized surfaces of said ceramic element and said dummy leads.

9. The capacitor of claim 8 including:

insulating means between said metallized surfaces of said ceramic element and said dummy leads.

10. The capacitor of claim 6 wherein:
each of said contact leads extends from an extended surface, the extended surfaces being in electrical contact with opposed metallized layers of said ceramic element; and
each of said dummy pins is mechanically anchored in said capacitor.

11. The capacitor of claim 6 wherein:
both of said dummy leads are mechanically anchored to the capacitor on one side of said ceramic element.

12. The capacitor of claim 11 including:
insulating means between said metallized surfaces of said ceramic element and said dummy leads.

13. The capacitor of claim 6 wherein:
one of said dummy leads is mechanically anchored to the capacitor on one side of said ceramic element, and the other of said dummy lads is mechanically anchored to the capacitor on the other side of said ceramic element.

14. The capacitor of claim 13 including:
insulating means between said metallized surfaces of said ceramic element and said dummy leads.

15. The capacitor of claim 1 wherein:
both of said dummy leads are mechanically anchored to the capacitor on one side of said ceramic element.

16. The capacitor of claim 15 including:
insulating means between said metallized surfaces of said ceramic element and said dummy leads.

17. The capacitor of claim 1 wherein:
one of said dummy leads is mechanically anchored to the capacitor on one side of said ceramic element, and the other of said dummy leads is mechanically anchored to the capacitor on the other side of said ceramic element.

18. The capacitor of claim 17 including:
insulating means between said metallized surfaces of said ceramic element and said dummy leads.

19. The capacitor of claim 1 wherein:
said first contact lead is diagonally spaced from said second contact lead.

20. The capacitor of claim 1 wherein:
said first dummy lead is diagonally spaced from said second dummy lead.

21. The capacitor of claim 20 wherein:
said first contact lead is diagonally spaced from said second contact lead.

22. A generally rectangular decoupling capacitor including:
a flat ceramic element;
a metallized layer on each of a pair of opposed surfaces of said ceramic element;
a pair of contact leads, one of said contact leads being electrically connected to one of said metallized layers and extending from the capacitor at a first position thereof, and the second of said contact leads being electrically connected to the other of said metallized layers and extending from the capacitor at a second position thereof; and
a pair of dummy leads, said dummy leads being electrically isolated from said metallized surfaces of said ceramic element, a first of said dummy leads extending from the capacitor at a third postion thereof, and the second of said dummy leads extending from the capacitor at a fourth position thereof;
said first and third positions and said second and fourth positions defining pairs of stabilized leads.

23. The capacitor of claim 22 wherein:
said first contact lead is diagonally spaced from said second contact lead.

24. The capacitor of claim 22 wherein:
said first dummy lead is diagonally spaced from said second dummy lead.

25. The capacitor of claim 24 wherein:
said first contact lead is diagonally spaced from said second contact lead.

26. The method of making a capacitor, including the steps of:
forming a metal strip having repeat sections including a main body portion of predetermined shape, a first extending part, and a second extending part;
positioning a first ceramic element on a main body portion, said ceramic element having opposed metallized surfaces;
positioning a second main body portion over said ceramic element, said second main body portion being reversed relative to said first main body portion;
encapsulating said first and second main body portions and the ceramic element therebetween in an insulating sheath; and
severing each of said main body portions from its strip to form a capacitor assembly wherein said body portions and first extending parts of said first and second main body portions are electrically connected to the opposed metallized surfaces of said ceramic element and said second extending parts are mechanically anchored but electrically isolated, said second extending parts forming diagonally spaced dummy leads.

27. The method of claim 26 including:
locating insulating spacers adjacent to said ceramic element and between parts of said main body portion which extend beyond said ceramic element.

28. The method of claim 26 wherein:
said first and second body portions are each on separate metal strips between registration carrier strips, one of said metal strips being reversed relative to the other.

29. The method of making a capacitor, including the steps of:
forming a metal strip having repeat sections including a main body portion of predetermined shape, a first extending part, and a second extending part;
positioning a ceramic element on a first main body portion, said ceramic element having opposed metallized surfaces;
positioning a second main body portion over said ceramic element, said second main body portion being reversed relative to said first main body portion;
encapsulating said first and second main body portions and the ceramic element therebetween in an insulating sheath; and
severing each of said main body portions from its strip to form a capacitor assembly wherein said body portions and first extending parts of said first and second main body portions are electrically connected to the opposed metallized surfaces of said ceramic element and said second extending parts are mechanically anchored but electrically isolated, said second extending parts forming spaced dummy leads.

30. The method of claim 29 including:
locating insulating spacers adjacent to said ceramic element and between parts of said main body portion which extend beyond said ceramic element.

31. The method of claim 29 wherein:
said first and second body portions are each on separate metal strips between registration carrier strips, one of said metal strips being reversed relative to the other.

* * * * *